United States Patent [19]
DiStefano et al.

[11] Patent Number: 5,455,390
[45] Date of Patent: Oct. 3, 1995

[54] MICROELECTRONICS UNIT MOUNTING WITH MULTIPLE LEAD BONDING

[75] Inventors: Thomas H. DiStefano, Monte Sereno, Calif.; John W. Smith, Jr., Austin, Tex.

[73] Assignee: Tessera, Inc., San Jose, Calif.

[21] Appl. No.: 190,779

[22] Filed: Feb. 1, 1994

[51] Int. Cl.⁶ ..................................................... H05K 1/00
[52] U.S. Cl. ........................ 174/262; 174/251; 174/254; 174/256; 174/267; 361/749; 361/776; 439/67; 439/77
[58] Field of Search ..................................... 174/251, 254, 174/256, 257, 262, 263, 264, 265, 266, 267; 361/749, 760, 772, 776; 439/67, 77; 257/30

[56] References Cited

U.S. PATENT DOCUMENTS

| | | |
|---|---|---|
| 3,373,481 | 3/1968 | Lins et al. . |
| 3,795,037 | 3/1974 | Luttmer . |
| 3,811,186 | 5/1974 | Larnerd et al. . |
| 4,067,104 | 1/1978 | Tracy . |
| 4,142,288 | 3/1979 | Flammer et al. . |
| 4,326,663 | 4/1982 | Oettel . |
| 4,447,857 | 5/1984 | Marks et al. . |
| 4,520,562 | 6/1985 | Sade et al. . |
| 4,629,957 | 12/1986 | Walters et al. . |
| 4,661,192 | 4/1987 | McShaen . |
| 4,667,219 | 5/1987 | Lee et al. . |
| 4,785,137 | 11/1988 | Samuels . |
| 4,793,814 | 12/1988 | Zifcak et al. . |
| 4,893,172 | 1/1990 | Matsummoto et al. . |
| 4,926,241 | 5/1990 | Carey . |
| 4,949,158 | 8/1990 | Ueda . |
| 4,954,877 | 9/1990 | Nakanishi et al. . |
| 4,954,878 | 9/1990 | Fox et al. . |
| 4,955,523 | 9/1990 | Calomagno et al. . |
| 5,047,830 | 9/1991 | Grabbe . |
| 5,049,085 | 9/1991 | Reylek et al. . |
| 5,067,007 | 11/1991 | Kanji et al. . |
| 5,072,289 | 12/1991 | Sugimoto et al. ........................ 357/68 |
| 5,131,852 | 7/1992 | Grabbe et al. . |
| 5,148,265 | 9/1992 | Khandros et al. ........................ 357/80 |
| 5,148,266 | 9/1992 | Khandros et al. ........................ 357/80 |
| 5,152,695 | 10/1992 | Grabbe et al. . |
| 5,173,055 | 12/1992 | Grabbe . |
| 5,197,892 | 3/1993 | Yoshizawa et al. . |
| 5,230,931 | 7/1993 | Yanizaki et al. . |
| 5,254,811 | 11/1993 | Ludden et al. . |
| 5,258,330 | 11/1993 | Khandros et al. ..................... 437/209 |

FOREIGN PATENT DOCUMENTS

| | | |
|---|---|---|
| 0072673A2 | 2/1983 | European Pat. Off. . |
| 61-91939 | 5/1986 | Japan . |
| 2151529 | 12/1984 | United Kingdom . |
| 2142568 | 1/1985 | United Kingdom . |
| 2151529 | 9/1985 | United Kingdom . |

OTHER PUBLICATIONS

"Method of Testing Chips and Joining Chips to Substrates", Research Disclosure, Feb. 1991, No. 322, Kenneth Mason Publication Ltd., England.

Primary Examiner—Leo P. Picard
Assistant Examiner—Cheryl R. Figlin
Attorney, Agent, or Firm—Lerner, David, Littenberg, Krumholz & Mentlik

[57] ABSTRACT

A component for mounting semiconductor chips or other microelectronic units includes a flexible top sheet with an array of terminals on it, and with flexible leads extending downwardly from the terminals. A compliant dielectric support layer surrounds the leads, holding the lead tips in precise locations. The leads are desirably formed from wire such as gold wire, and have eutectic bonding alloy on their tips. The component can be laminated to a chip or other unit under heat and pressure to form a complete subassembly with no need for individual bonding to the contacts of the chip. The subassembly can be tested readily and provides compensation for thermal expansion.

23 Claims, 4 Drawing Sheets

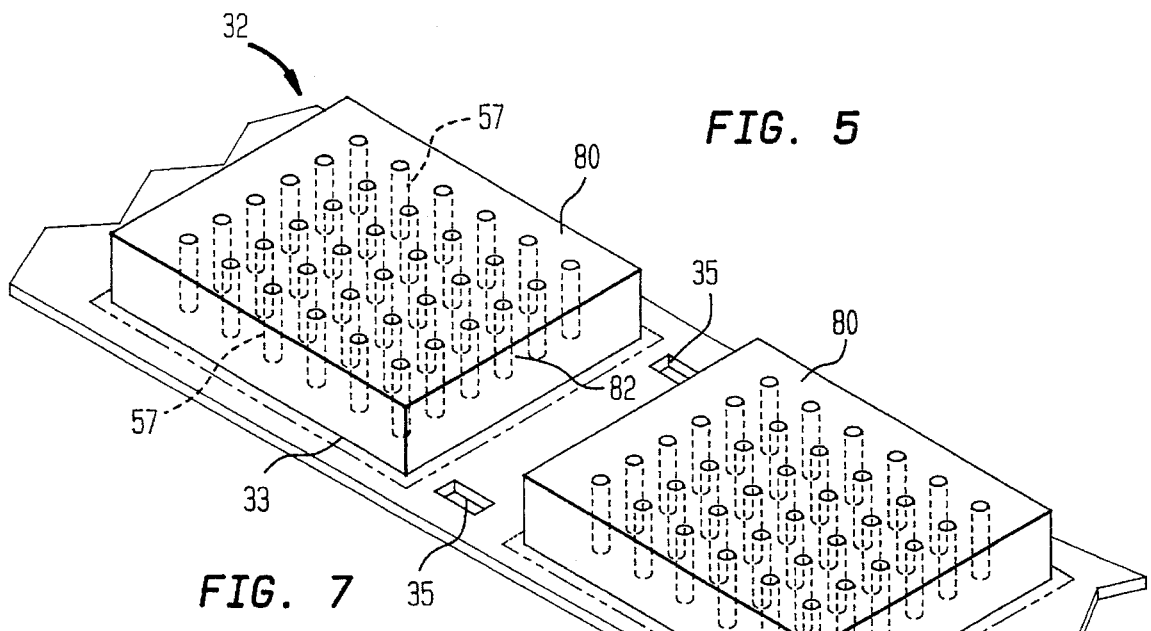
FIG. 5
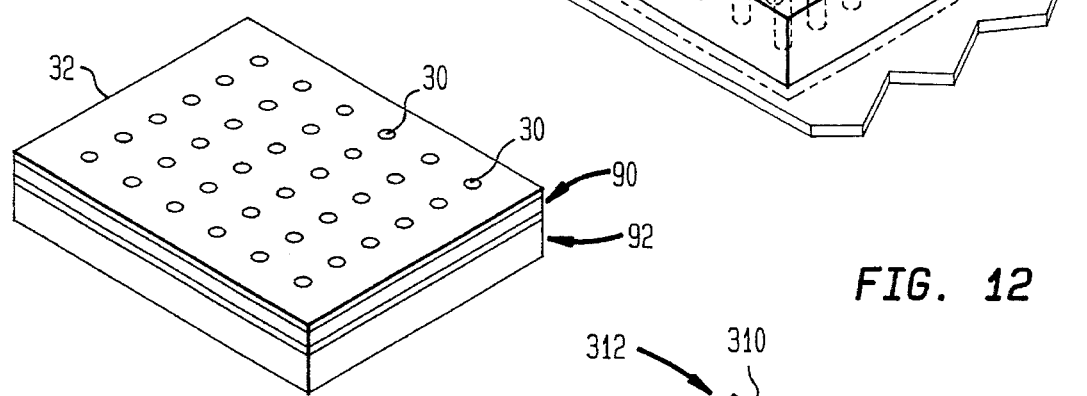
FIG. 7
FIG. 12
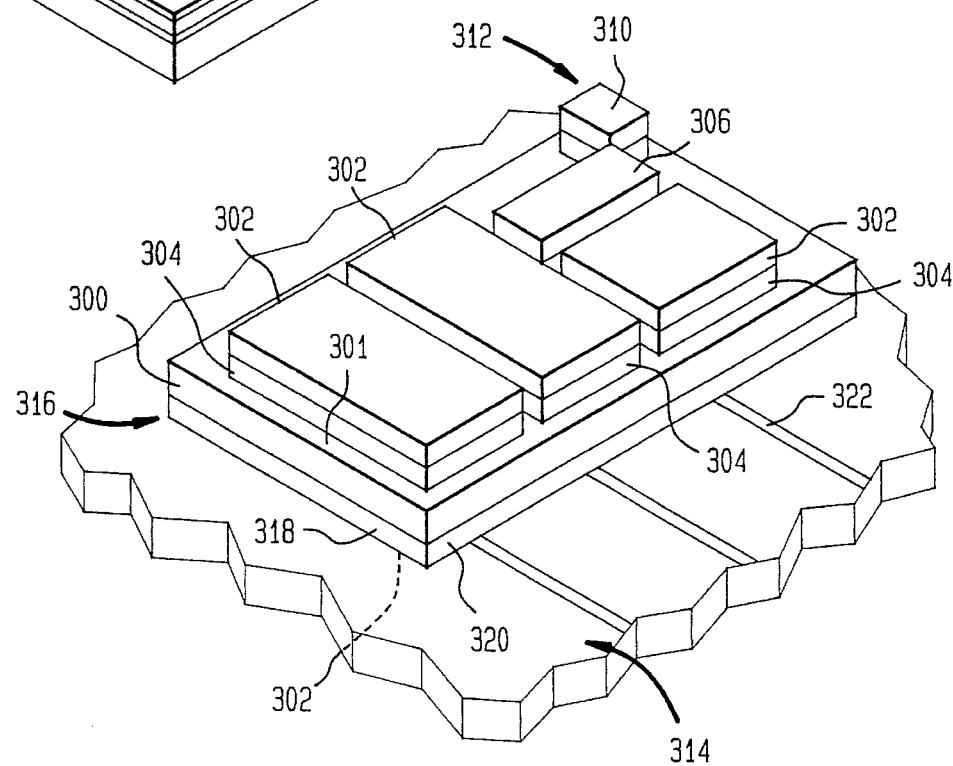

MICROELECTRONICS UNIT MOUNTING WITH MULTIPLE LEAD BONDING

FIELD OF THE INVENTION

The present invention relates to mounting and connection devices and techniques for use with microelectronic units such as semiconductor chips.

BACKGROUND OF THE INVENTION

Complex microelectronic devices such as modern semiconductor chips require numerous connections to other electronic components. For example, a complex microprocessor chip may require many hundreds of connections to external devices. Semiconductor chips commonly have been connected to electrical traces on mounting substrates by one of three methods: wire bonding, tape automated bonding, and flip-chip bonding. In wire bonding, the chip is positioned on a substrate. Individual wires are connected between the electrical contacts on the chip and pads on the substrate. In tape automated bonding, a flexible dielectric tape with a prefabricated array of cantilever leads thereon is positioned over the chip and substrate. The individual leads are bonded to the contacts on the chip The leads are also connected to pads on the substrate. In both wire bonding and conventional tape automated bonding, the pads on the substrate are arranged outside of the area covered by the chip, so that the wires or leads fan out from the chip to the surrounding pads. The area covered by the subassembly as a whole is considerably larger than the area covered by the chip. Because the speed with which a microelectronic assembly can operate is inversely related to its size, this presents a serious drawback. Moreover, the wire bonding and tape automated bonding approaches are generally most workable with chips having contacts disposed in rows extending along the edges of the chip. They generally do not lend themselves to use with chips having contacts disposed in a so-called area array, i.e., a gridlike pattern covering all or a substantial portion of the chip front surface.

In the flip-chip mounting technique, the contact bearing top surface of the chip faces towards the substrate. Each contact on the chip is joined by a solder bond to the corresponding pad on the substrate, as by positioning solder balls on the substrate or chip, juxtaposing the chip with the substrate in the front-face-down orientation and momentarily melting or reflowing the solder. The flip-chip technique yields a compact assembly, which occupies an area of the substrate no larger than the area on the chip itself. However, flip-chip assemblies suffer from significant problems with stress caused by differential thermal expansion and contraction. The solder bonds between the chip contacts and substrate are substantially rigid. Changes in the size of the chip and of the substrate due to thermal expansion and contraction in service create substantial stresses in these rigid bonds, which in turn can lead to fatigue failure of the bonds. Moreover, it is difficult to test the chip before attaching it to the substrate, and hence difficult to maintain the required outgoing quality level in the finished assembly, particularly where the assembly includes numerous chips.

Numerous attempts have been made to solve the foregoing problems. Useful solutions are disclosed in commonly assigned U.S. Pat. Nos. 5,148,266; 5,148,265 and 5,258,330. Preferred embodiments of the structures disclosed in these patents incorporate flexible, sheetlike structures referred to as "interposers" or "chip carriers". The preferred chip carriers have a plurality of terminals disposed on a flexible, sheetlike top layer. In use, the interposer is disposed on the front or contact bearing surface of the chip with the terminals facing upwardly, away from the chip. The terminals are then connected to the contacts of the chip. Most preferably, this connection is made by bonding prefabricated leads on the interposer to the chip contacts, using a tool engaged with the lead. The completed assembly is then connected to a substrate, as by bonding the terminals of the chip carrier to the substrate. Because the leads and the dielectric layer of the chip carrier are flexible, the terminals on the chip carrier can move relative to the contacts on the chip without imposing significant stresses on the bonds between the leads and the chip, or on the bonds between the terminals and the substrate. Thus, the assembly can compensate for thermal effects. Moreover, the assembly most preferably includes a compliant layer disposed between the terminals on the chip carrier and the face of the chip itself as, for example, an elastomeric layer incorporated in the chip carrier and disposed between the dielectric layer of the chip carrier and the chip. Such a compliant structure permits displacement of the individual terminals independently towards the chip. This permits effective engagement between the subassembly and a test fixture. Thus, a test fixture incorporating numerous electrical contacts can be engaged with all of the terminals in the subassembly despite variations in the height of the terminals. The subassembly can be tested before it is bonded to a substrate so as to provide a tested, known, good part to the substrate assembly operation. This in turn provides very substantial advantages.

Despite these and other advances in the art, it would still be desirable to provide further improvements in semiconductor chip assemblies, components for such assemblies and methods of making the same. Thus, further improvement would be desirable in the ability to form bonds to the chip without damage to the chip; in the ability to connect chips with closely-spaced contacts; and in the ability to connect chips with contacts in an area array. Moreover, further improvement in the speed and reliability of the connection process would be desirable. It would also be desirable to bottom end of the lead and may also have an enlarged transition section at a juncture between the wire and the associated terminal. In effect, the lower ends of the leads are arrayed on the component in a plane adjacent the bottom surface of the support layer, so that all of the leads can be engaged with contacts on a chip or other microelectronic unit simultaneously, by juxtaposing the tips of the leads with the contact-bearing surface of the microelectronic unit. Most preferably, the leads are wires formed from a structural metal such as gold or a gold alloy, and each lead has a layer of a bonding material different from the structural metal on the bottom end, i.e., on the tip of the wire remote from the top sheet. The bonding material is adapted to form an electrically conductive bond between the lead and the contact of the chip or other microelectronic unit upon exposure to the predetermined activation temperature. The bonding material may be a metal or other conductive material arranged to form a liquid phase upon exposure to the activation temperature. Preferably, where the structural metal includes gold, the bonding material is a bonding metal including tin-gold alloy, germanium-gold alloy, silicon-gold alloy or another metal adapted to form a low-melting eutectic composition with gold. Alternatively, the bonding material may be a conductive polymer composition, such as a polymer or polymer-forming material with a metallic or other conductive particles dispensed therein. Thus, all of the leads can be bonded to the contacts on the chip or other microelectronic unit with a permanent, metallurgical bond.

The terminals and leads can be arranged in a pattern corresponding to the pattern of contacts on the chip or other microelectronic unit. Because all of the leads are arranged for bonding to the microelectronic unit by simple application of heat and pressure to the entire assembly of the connection component and the microelectronic unit, there is no need to provide spaces between the leads or terminals provide similar improvements with respect to assemblies incorporating other microelectronic components. For example, certain microelectronic units such as multichip modules incorporate a rigid dielectric circuit panel having numerous contacts disposed at very small spacing. Connecting such a panel to a larger substrate poses problems similar to those encountered in mounting a semiconductor chip to the substrate and hence poses similar needs for improvement.

SUMMARY OF THE INVENTION

The present invention addresses these needs.

One aspect of the present invention provides a component for forming connections to a microelectronic unit. The component according to this aspect of the invention desirably includes a flexible dielectric top sheet and a plurality of conductive terminals mounted on the top sheet. Preferably, the plural terminals are disposed in an array corresponding to the array of contacts on the chip or other microelectronic unit to be mounted. The component preferably includes a support layer disposed underneath the top sheet, the support layer having a bottom surface remote from the top sheet. A plurality of electrically conductive, elongated leads are connected to the terminals on the top sheet and extend generally side by side downwardly from the terminals through the support layer. Each lead has a lower end adjacent to the bottom surface of the support layer. The lower ends of the leads are adapted to bond to contacts on a microelectronic unit when the component is engaged with such unit under predetermined temperature and pressure conditions, so that the bonded leads will connect the terminals of the top sheet with the contacts on the surface of the microelectronic unit. The support layer surrounds and supports the leads.

Most preferably, the leads are flexible and curved. Each lead may include a wire connected to one terminal. The wire may have a bulbous tip remote from the terminal at the for access by a bonding tool. The terminals and leads can be provided at small center to center spacing distances, and can be provided in a grid or array covering any desired region of the dielectric layer. Preferred components according to this aspect of the present invention are particularly useful with chips or other microelectronic units having components disposed in a so-called "area array" i.e., an arrangement where the contacts are disposed in a grid covering the surface of the unit. Moreover, components according to this aspect of the present invention greatly facilitate the subassembly process, as discussed in greater detail below. Because the support layer supports each lead or wire before bonding to the chip or other microelectronic unit, extremely fine wires can be employed. Thus, components intended for connection to semiconductor chips desirably have leads formed from wire less than about 50 microns in diameter spaced at distances less than about 1 mm from one another. Components intended for use with other microelectronic units typically have leads formed from wire less than about 100 microns in diameter, spaced less than about 2.5 mm from one another. Even with these fine wires, the component is rugged enough to be handled and juxtaposed with the chip. Components according to this aspect of the present invention are particularly well suited for use with chips and other components having small spacing between adjacent contacts.

The support layer may include a compliant dielectric layer as, for example, an elastomeric layer. Such a compliant layer remains in place after the connection component is engaged with the microelectronic unit, so as to permit vertical movement of the terminals on the flexible dielectric layer and thus provide vertical compliance for testing and assembly purposes that is, the ability to move in the direction perpendicular to the face of the chip or unit, commonly referred to as the "Z" direction in the semiconductor art. Moreover, because the leads are flexible, the contact bearing surface of the chip or other microelectronic unit is free to move relative to the terminals on the top layer in horizontal directions, parallel to the top layer, i.e., in the directions commonly referred to as the "X" and "Y" directions in the semiconductor art. Thus, when the terminals are bonded to a substrate, differential expansion of the substrate and the microelectronic unit or chip will not impose appreciable stresses on the terminal to substrate or lead to chip bonds. The combination of curved leads and a flexible top layer is particularly advantageous. The curved leads can flex, and can also straighten slightly to accommodate horizontal movement of the terminals relative to the contacts on the chip.

In an alternative arrangement, the support layer may be arranged so that it can be removed from between the dielectric layer and the microelectronic unit surface after assembly of the component to the chip. For example, the support layer may be formed from a material which is soluble in at least one solvent which does not dissolve or attack the dielectric top sheet, so that the support layer can be removed by exposure to such solvent. This arrangement provides the requisite support to the leads prior to and during assembly, but also allows removal of the support layer so as to provide a space for introduction of any desired sealant or encapsulant.

According to a further aspect of the invention, a component for forming connections to a microelectronic unit may include a dielectric structure having top and bottom surfaces as, for example, a top sheet and compliant layer as discussed above. Here again, the component includes a plurality of electrically conductive terminals, these being disposed adjacent the top surface of the dielectric structure and a plurality of electrically conductive, elongated leads, extending downwardly from the terminals through the dielectric structure, as through the support layer discussed above. Each lead has a lower end adjacent the bottom surface of the dielectric structure. Here again, the lower ends of the leads are adapted to bond to the contacts on the surface of the microelectronic unit under predetermined pressure and temperature conditions. In components according to this aspect of the invention, an adhesive or other sealant is disposed on the bottom surface of the dielectric structure. The sealant is adapted to seal the bottom surface of the dielectric structure to the microelectronic unit when the component is juxtaposed with the microelectronic unit and subjected to the aforementioned predetermined temperature and pressure conditions. Thus, components according to this aspect of the invention will form the electrical connections between the lead bottom ends and the contact pads on the chip or other unit and also simultaneously form a sealed interface between the microelectronic unit and the dielectric structure of the connection component. This provides a significant advantage inasmuch as it eliminates the possibility of air entrapment between the connection component dielectric structure and the microelectronic unit and thus eliminates the possibility of air-induced defects.

A further aspect of the invention provides methods of making connections to a chip or other microelectronic unit. Methods according to this aspect of the present invention desirably include the steps of providing a connection component including a flexible dielectric top sheet, a plurality of terminals on the top sheet and a plurality of electrically conductive elongated flexible leads connected to the terminals and extending side by side downwardly from the terminals away from the top sheet to bottom ends remote from the top sheet and engaging the connection component with a surface of a microelectronic unit such as a chip having an array of contacts thereon while subjecting the connection component and microelectronic unit to heat and pressure so that a plurality of the lead bottom ends bond simultaneously with a plurality of contacts on the microelectronic unit. Most preferably, all of the lead bottom ends bond simultaneously with contacts on the microelectronic unit. The connection component desirably includes a support layer, and the support layer desirably surrounds and supports the leads prior to and during the engaging step. The engaging step may include the step of supporting the top sheet on a platen so that the leads extend away from the platen and urging the microelectronic unit towards the platen into engagement with the bottom ends of the leads.

Methods according to this aspect of the present invention may further include the step of connecting the terminals on the top sheet to contact pads on a substrate, so as to electrically interconnect the contacts of the microelectronic unit through the leads and terminals to the substrate. The method preferably further includes the step of testing the subassembly of the connection component and microelectronic unit prior to this step by engaging the terminals on the top sheet with a test fixture. The method may optionally include the step of removing the support layer after the step of engaging the component with the microelectronic unit, as by exposing the assembled unit and component to a solvent and may further include the step of forming a new, compliant layer between the microelectronic unit and the top sheet by injecting a curable liquid therebetween and curing the liquid to form a compliant material. Alternatively, the connection component as initially provided may incorporate a compliant support layer such as an elastomeric layer beneath the flexible top sheet.

According to yet a further aspect of the invention, a connection component as aforesaid incorporating a dielectric structure and array of terminals on the top surface of the dielectric structure and leads extending through the dielectric structure from the terminals to bottom ends at a bottom surface of the dielectric structure may be engaged with a front surface of a microelectronic unit such as a chip having an array of contacts thereon while subjecting the connection component and unit to heat and pressure so that the bottom surface of the dielectric layer forms a sealed interface with the front surface of the microelectronic unit and the bottom ends of the leads on the connection component bond with the contacts on the unit, all in a single operation. In this arrangement, the connection component desirably includes an adhesive or other sealant on the bottom surface of the dielectric structure which momentarily forms a liquid phase at the interface with the microelectronic unit during the engaging step.

Still further aspects of the invention include methods of making a connection component for a microelectronic unit. Methods according to this aspect of the invention desirably include the step of providing a top sheet having an array of terminals thereon and attaching a lead to each terminal so that the leads attached to the various terminals extend generally side by side downwardly away from the top sheet, with a bottom end of each lead being remote from the top sheet. Methods according to this aspect of the invention most preferably include the step of injecting a flowable, curable dielectric material around the leads and curing the flowable material to form an additional dielectric layer such as a support layer surrounding the leads. Most preferably, the method includes the step of juxtaposing a first fixture with the top sheet and the leads so that the fixture engages the bottom ends of the leads but is spaced apart from the top sheet prior to the step of injecting the curable dielectric material. Thus, the flowable dielectric material is confined between the first fixture and the bottom side of the top sheet. The first fixture may be a platen having a generally flat surface facing toward the top sheet. The method may also include the step of engaging a second fixture with a top side of the top sheet remote from the first fixture so that the top sheet and leads are engaged between these fixtures. The method may further include the step of deforming the leads to bring the bottom ends of the leads to a common, predetermined distance from the top sheet bottom surface by forcing these fixtures towards one another. The first fixture may have a lead engaging surface facing towards the top sheet with an array of pockets at preselected locations thereon. The bottom end of each lead may be engaged in a preselected pocket prior to the deforming step, so that the bottom ends of the leads will be brought to preselected locations corresponding to the locations of the pockets during the deforming step. The deforming step may be performed so as to buckle or bend each such lead. Thus, each lead may be a generally columnar structure and the deforming step may cause each lead to bend transversely to its direction of elongation.

The step of attaching the leads to the terminals on the top sheet may include the step of bonding a wire to each terminal so that the wire extends from the terminal and then severing the wire so that the severed end of the wire forms the bottom end of the lead. The severing step may be performed by a "flaming off" process, i.e., by heating the wire at one location along its length with a microflame, electric arc or other heat source so as to melt the wire and thus form a bulbous portion at the severed bottom end. The method may also include the step of applying a bonding metal to the bottom ends of the leads and may further include the step of applying a sealant such as an adhesive to the bottom surface of the dielectric layer formed by the flowable material. The manufacturing process may be automated readily and may provide compact and high quality connection components at reasonable cost, with extremely high reliability.

These and other objects, features and advantages will be more readily apparent from the detailed description of the preferred embodiments set forth below, taken in conjunction with the accompanying drawings.

BRIEF DESCRIPTION OF THE DRAWINGS

FIG. 5 is a diagrammatic perspective view of the component illustrated in FIGS. 1–4.

FIG. 7 is a diagrammatic perspective view depicting a subassembly of the component and chip illustrated in FIGS. 1–6.

Figure 8:
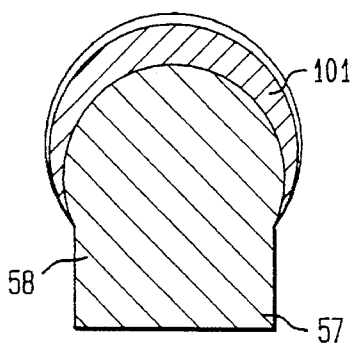
Figure 9:
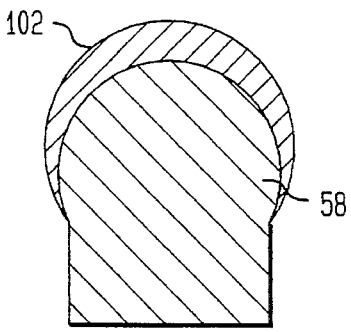

Each of FIGS. 8 and 9 is a fragmentary diagrammatic sectional view on an enlarged scale illustrating portions of components in accordance with further embodiments of the invention.

Figure 10:
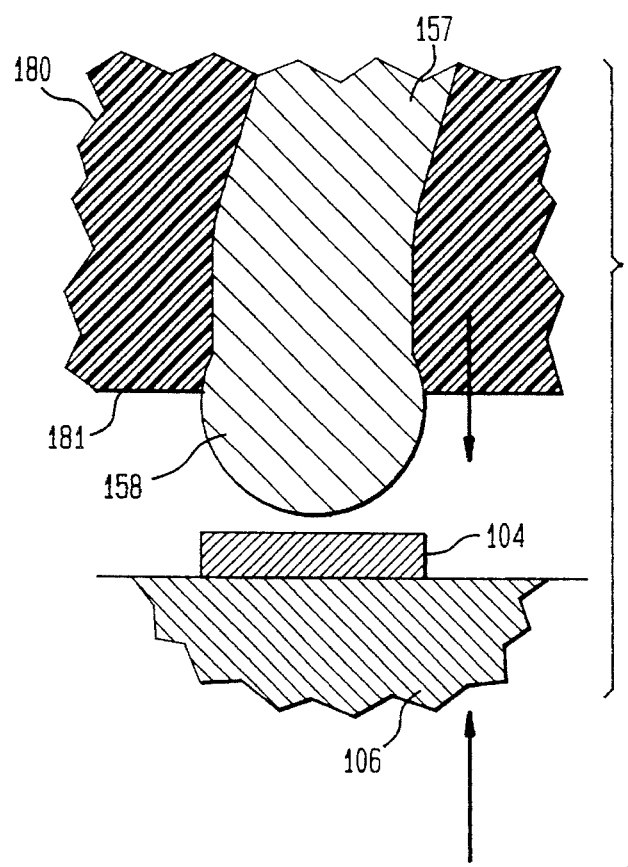
Figure 11:
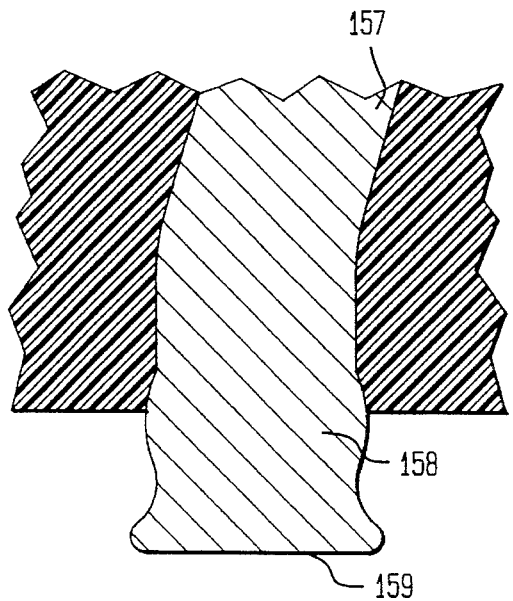

FIGS. 10 and 11 are diagrammatic fragmentary sectional views illustrating portions of a further component manufacturing process and component.

FIG. 12 is a fragmentary, diagrammatic perspective view depicting an assembly according to a further embodiment of the invention.

DETAILED DESCRIPTION OF THE PREFERRED EMBODIMENTS

A component manufacturing process in accordance with one embodiment of the present invention includes the step of forming an array of metallic, electrically conductive terminals 30 on a flexible sheet 32, referred to herein as a top sheet. Top sheet 32 may be a polyimide film of the type commonly utilized as a flexible electronic circuit panel. Thus, top sheet 32 commonly is between about 15 microns and about 50 microns thick, and most typically is about 25 microns thick. One suitable film is available from the E. I. DuPont de Nemours Company of Wilmington, Delaware under the trademark Kapton E. Top sheet 32 has a top surface 34 and a bottom surface 36. Preferably sheet 32 is formed as a large continuous or semi-continuous tape so that the continuous tape includes numerous zones 33 (seen in a later stage of assembly in FIG. 5), each zone corresponding to the area required for mounting one chip or other microelectronic unit. The tape may also include holes 35 (FIG. 5) or other conventional features for engagement by handling and movement devices.

Figure 1:
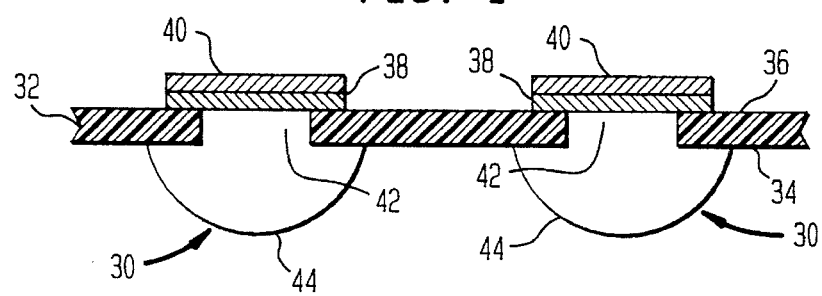
FIG. 1 is a fragmentary diagrammatic sectional view depicting parts of a connection component in accordance with one embodiment of the present invention during one stage of the component manufacturing process.
Figure 2:
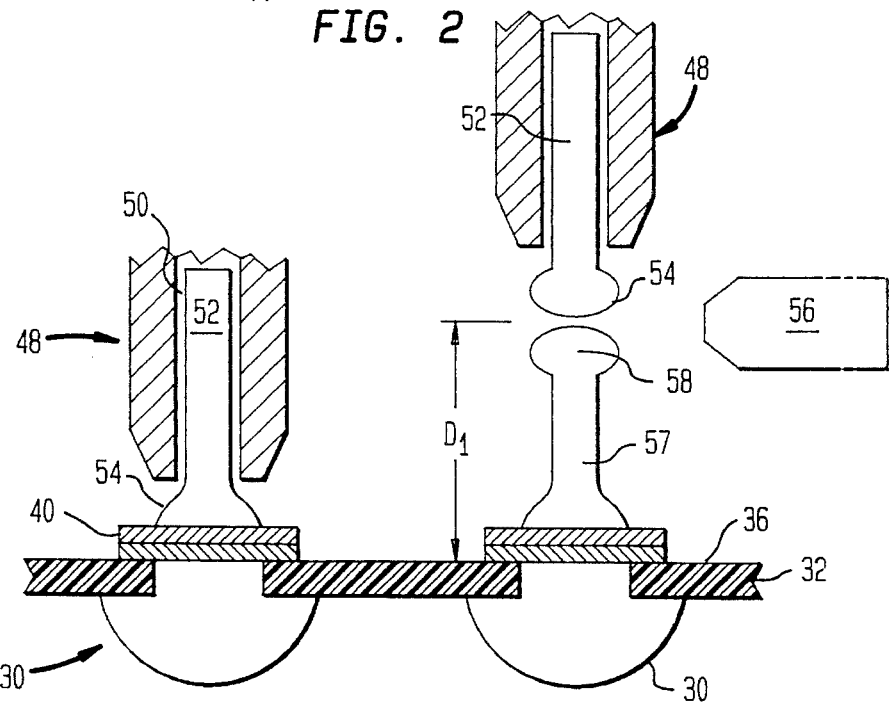
FIG. 2, 3 and 4 are fragmentary schematic sectional views similar to FIG. 1 but depicting the component during successive stages of the process.
Figure 3:
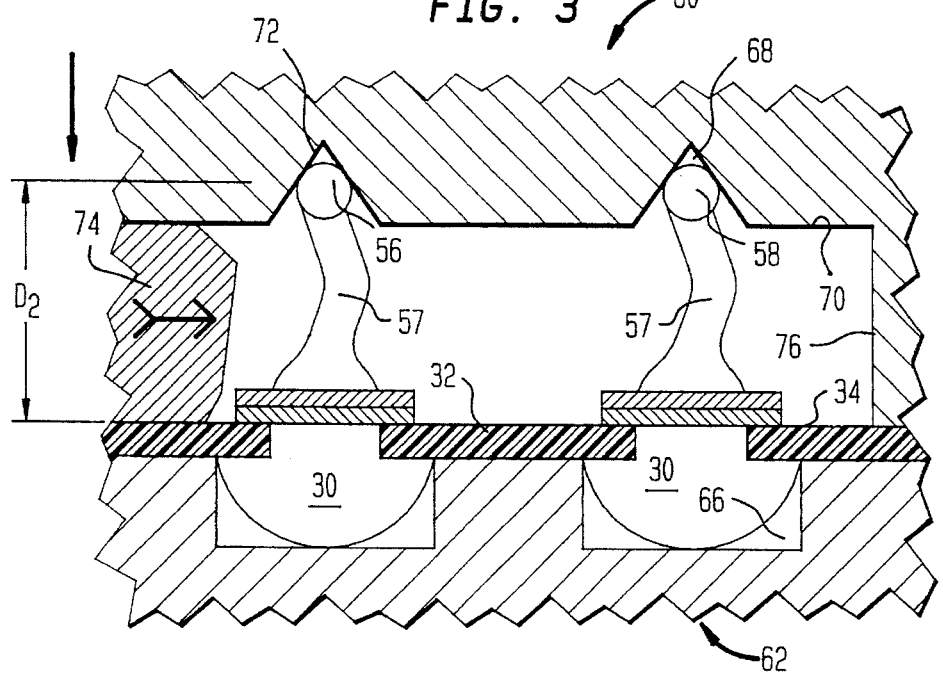
Figure 4:
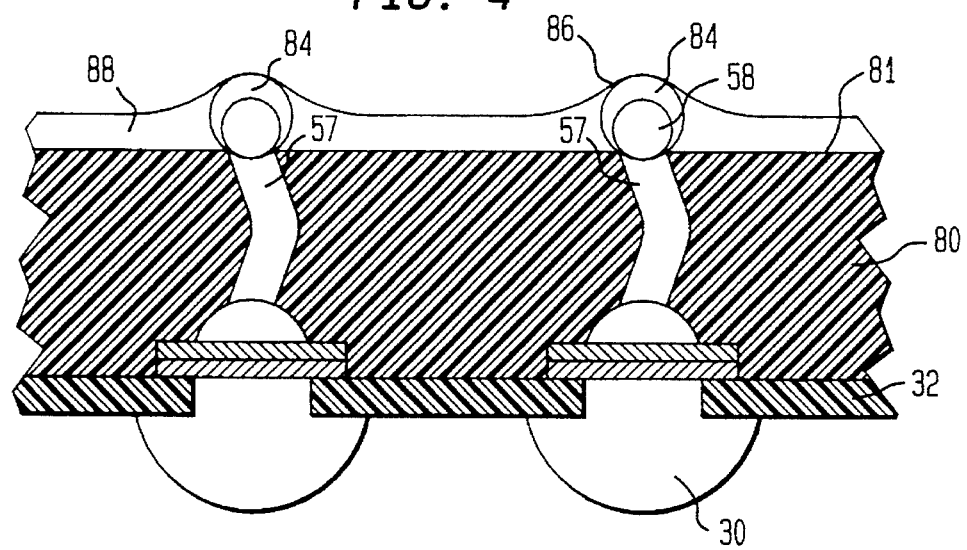

As illustrated in FIG. 1, the sheet is in an inverted disposition with the top surface 34 facing towards the bottom of the drawing and the bottom surface 36 facing to the top of the drawing. As used in this disclosure, with reference to components intended for mounting on a semiconductor chip or other similar microelectronic unit, the "upward" direction is the direction which will be normal to and away from the face of the contact-bearing surface of the chip or unit during service whereas the downward direction is the opposite direction. In FIGS. 1–4, the directions are inverted, so that the downward direction of the component is toward the top of the drawing The "horizontal" directions are directions transverse to the upward and downward directions. Thus, the horizontal directions are to the right and left in the drawing and into and out of the plane of the drawing in FIG. 1. The fragmentary views in FIGS. 1–3 depict only a small portion of top sheet 32 and the related elements forming two leads and two terminals. In actual practice, the connection component will include hundreds to thousands of leads and terminals.

At the beginning of the process, top sheet 32 has a layer of copper 38 over the entirety of bottom surface 36. This layer commonly is between about 5 and about 15 microns thick and most commonly about 10 microns thick. An array of gold dots 40 is deposited on the copper layer using a conventional masking and electroplating process, the gold dots typically being about 1 micron thick. These gold dots are deposited at locations corresponding to the locations of the contact pads on the chip with which the component will be employed. In the arrangement shown, the gold dots are deposited on the copper layer in a grid or "area array", so that the dots are disposed in rows and columns side by side adjacent one another. Holes 42 are then formed in top sheet 32 by hole formation processes such as laser ablation, chemical etching or plasma etching. Typically, a mask is applied to top surface 34 of top sheet 32, and the top sheet is then exposed to the etchant. Following the etching process, the holes may be cleaned, as by exposing the part to an oxygen plasma process. During this exposure, the copper layer 38 may be protected by a temporary resist layer. After hole formation and cleaning, a metal such as nickel is plated in the holes so as to form the bodies of terminals 30 metallurgically bonded with copper layer 38 in each hole. The nickel is then covered by a thin layer of gold 44. The assembly is then exposed to a further etchant which attacks the copper layer 38 in those regions not covered by gold dots 40, leaving only those portions of the copper layer illustrated in FIG. 1. Thus, at the end of the terminal forming process, each terminal 30 extends from the top surface 34 of sheet 32 to the bottom surface 36, and each terminal includes a generally flat, gold covered region 40 facing downwardly on the bottom side 36 of the top sheet 32.

In the next stage of the process, leads are connected to terminals 30. As illustrated in FIG. 2, the lead forming process uses a tubular, needle-like wire bonding capillary 48, having an internal bore 50. A fine gold wire 52, less than about 100 microns, more preferably less than about 50 microns and desirably about 25 microns in diameter, extends through bore 50 to the tip of capillary 48. Wire 52 has an integrally formed ball or bulge 54 at its tip. Capillary 48 is aligned with the pad 40 of one terminal 30 and advanced so as to engage ball 54 with pad 40. Heat, ultrasonic energy and pressure are then applied through capillary 48 so as to fuse ball 54 with pad 40, thereby forming an enlarged section in wire 52 adjacent the terminal 30 and permanently joining the wire to the terminal. This fusing process is commonly referred to as "thermosonic bonding." As illustrated in the right hand portion of FIG. 2, the capillary 48 is then retracted away from sheet 32 and away from the terminal, paying out wire 52 and forming an elongated lead 57 extending away from the terminal. Heat is then applied at a preselected location along wire 52, at a predetermined distance $D_1$ from sheet 32, so as to sever the wire. The heat may be applied by a hot gas source or nozzle 56, by a small flame, by an electric arc or by any other source capable of heating the wire at the preselected location. This process, commonly referred to as "flaming off" forms a bulbous section or ball 58 at the bottom end or tip of the lead 57 remote from the associated terminal 30 and remote from top sheet 32. The same process also forms a further ball 54 on the end of wire 52, so that the process can be repeated. Although only two terminals and two leads 57 are shown being formed in FIG. 2, the actual process involves formation of similar leads on all of the terminals. Moreover, although capillary 48 is illustrated as dispensing only a single wire 52 so as to form only a single wire 57, the capillary may include numerous holes to dispense a plurality of wires simultaneously, and to bond these wires simultaneously to an entire row of terminals. Also, numerous capillaries may operate simultaneously.

Following the lead formation process the top sheet 32 has an array or "forest" of leads protruding in the downward direction (in the direction to the top of the drawing in FIG.

2), each such lead extending away from the bottom surface 36 of the sheet and away from the associated terminal 30. Following the forming step illustrated in FIG. 2, the component is engaged between a first platen 60 and a second platen 62. Top sheet 32 is disposed on the face 64 of second platen 62. This face is provided with recesses 66 for receiving the protruding portions of terminals 30. First platen 60 has an array of pockets 68 in its face 70. Pockets 68 are disposed at locations corresponding to the desired locations for the tips of leads 57, i.e., at locations corresponding to the locations of the contacts on the chip or microelectronic unit. Pockets 68 are aligned with the pockets 66 in second platen and hence with the leads 57 and terminals 30. Platen 70, including pockets 68, has a surface resistant to bonding by the curable elastomer and adhesive discussed below. Thus the platen may be covered by a thin layer of a release agent 72 such as a silicone fluid. The release fluid renders surface 70, resistant to bonding by the elastomer and adhesive discussed below. The surface may also have a more permanent release agent such as a fluoropolymer.

Platens 60 and 62 are advanced towards one another so that the bulbous tips 58 are engaged in pockets 68. As the platens continue to advance towards one another, each lead 57 is deformed. The advance of the platens is continued until the platens reach a predetermined spacing. This brings each of the ends or bulbous tips or bottom ends 58 of the leads to a predetermined post-forming distance $D_2$ from top sheet 32. Preferably, the advancing platen deforms all of the leads at least partially in plastic deformation so that each lead takes a permanent set to the desired distance $D_2$. That is, the bottom ends 58 of the leads are brought into a common plane substantially parallel to the plane of the top sheet 32. This deformation desirably brings each lead to a slightly curved condition, as by bending or buckling the lead. As used in this disclosure, the term "curved" includes kinked or bent shapes, as well as, arcuate and other smoothly curved shapes.

While the platens are in their fully advanced condition, a flowable, curable dielectric material 74 is injected into the space between platen 60 and sheet 32, so that the flowable material surrounds leads 57. Most preferably, flowable material 74 in its uncured condition has a very low viscosity and surface tension so that it effectively fills all of the spaces between all of the leads. Dielectric material 74 is arranged to form an elastomer upon cure. Suitable materials include curable silicone such as that sold under the trademark Dow 577 Silicone by the Dow Corning Corporation of Midland, Michigan, and other curable silicones available from Shin-Etsu Silicones of America, Inc. Because the bulbous tips 58 of the leads are engaged in pockets 68 and engaged with the release material 72, the curable material does not substantially cover these tips. Preferably, platen 60 is provided with a raised edge portions 76. Each edge portion 76 engages the surface 34 of sheet 32 outside of the area covered by the array of terminals 30 and leads 57 and thereby confines the flowable material to a preselected zone of the sheet encompassing the array of leads. While the sheet and flowable material are held between the platens, the flowable material is cured to form an elastomeric, compliant support layer 80. The thickness of layer 80 desirably is slightly less than the post-forming dimension $D_2$ of leads 57. Typically, the thickness of support layer 80 is about 100 to about 1000 microns and preferably about 200 microns. Support layer 80 has a bottom face 81 remote from top sheet 32 and adjacent lead tips 58 of leads 57. However, the lead tips protrude slightly from face 81. As seen in FIG. 5, layer 80 has a rectangular border 82 formed by the projecting portion 76 of platen 60 (FIG. 3). As also illustrated in FIG. 5, there may be a plurality of layers 80, each encompassing one array of leads 57 on a single continuous sheet 32.

After layer 80 has been formed, platens 62 and 60 are removed and any residue of the release layer is removed, as by washing the assembly in a suitable solvent. Following removal of the solvent, a layer of a bonding metal 84 is applied on the tip or bottom end 58 of each lead 57. The bonding metal is a metal arranged to form a liquid metallic phase at a relatively low bonding metal activation temperature and to solidify into a secure bond with the metal of lead 57 and with the metallic contact pads on the semiconductor chip or other microelectronic unit with which the component will be used. Where leads 57 include gold or gold alloy, bonding metal 84 preferably is selected from the group consisting of tin, alloys of gold with tin, or with germanium, or with silicon or with combinations of these metals, and more preferably is selected from the group consisting of alloys of gold and tin. Bonding metal 84 may be deposited by plating on tips 58. To inhibit oxidation of the bonding metal, a further thin layer of gold 86 may be applied by further plating over bonding metal 84.

A layer 88 of a heat activatable adhesive is applied on the bottom face 81 of elastomeric layer 80, so that the adhesive layer covers essentially the entire bottom face 81. The adhesive may also cover the tips 58 of leads 57. Preferably, however, any such coverage is minimal. Thus, the thickness of layer 88 desirably is not substantially greater than the distance by which the tips protrude beyond the bottom surface 81 of layer 80. The adhesive of layer 88 preferably is arranged to remain solid and non-tacky at room temperature, but is arranged to form a flowable, liquid phase momentarily when raised to a preselected adhesive activation temperature and then form a solid bond. The adhesive activation temperature may be either above or below the bonding metal activation temperature. However, the adhesive should be capable of withstanding momentary exposure to the bonding metal activation temperature. The adhesive activation temperature desirably is a temperature above room temperature, but below the temperature which would be damaging to the layers of the connection component or to the semiconductor structure which will be used with the connection component. Desirably, the adhesive activation temperature is between about 40 degrees C and 160 degrees C. The thermosetting adhesives commonly referred to as "snap-cure" adhesives can be utilized. One suitable solvent-free snap-cure adhesive is sold under the trademark ABLE-BOND 967-3, by the Ablestik Electronic Materials & Adhesives Company of Rancho Dominguez, Calif.

The uncured adhesive may be deposited on the bottom surface 81 of support layer 80 by dispersing or dissolving the adhesive ingredients in a volatile liquid vehicle. The resulting mixture is then deposited on the bottom surface in the desired pattern by essentially any method of pattern wise liquid deposition as, for example, by stenciling, by silk screening or by, gravure printing, or by processes which employ photosensitive masking agents and patternwise illumination to form a stencil or mask for adhesive application. After the mixture has been deposited, the liquid vehicle is removed by evaporation, leaving a thin layer of uncured adhesive in the desired pattern.

Figure 6:
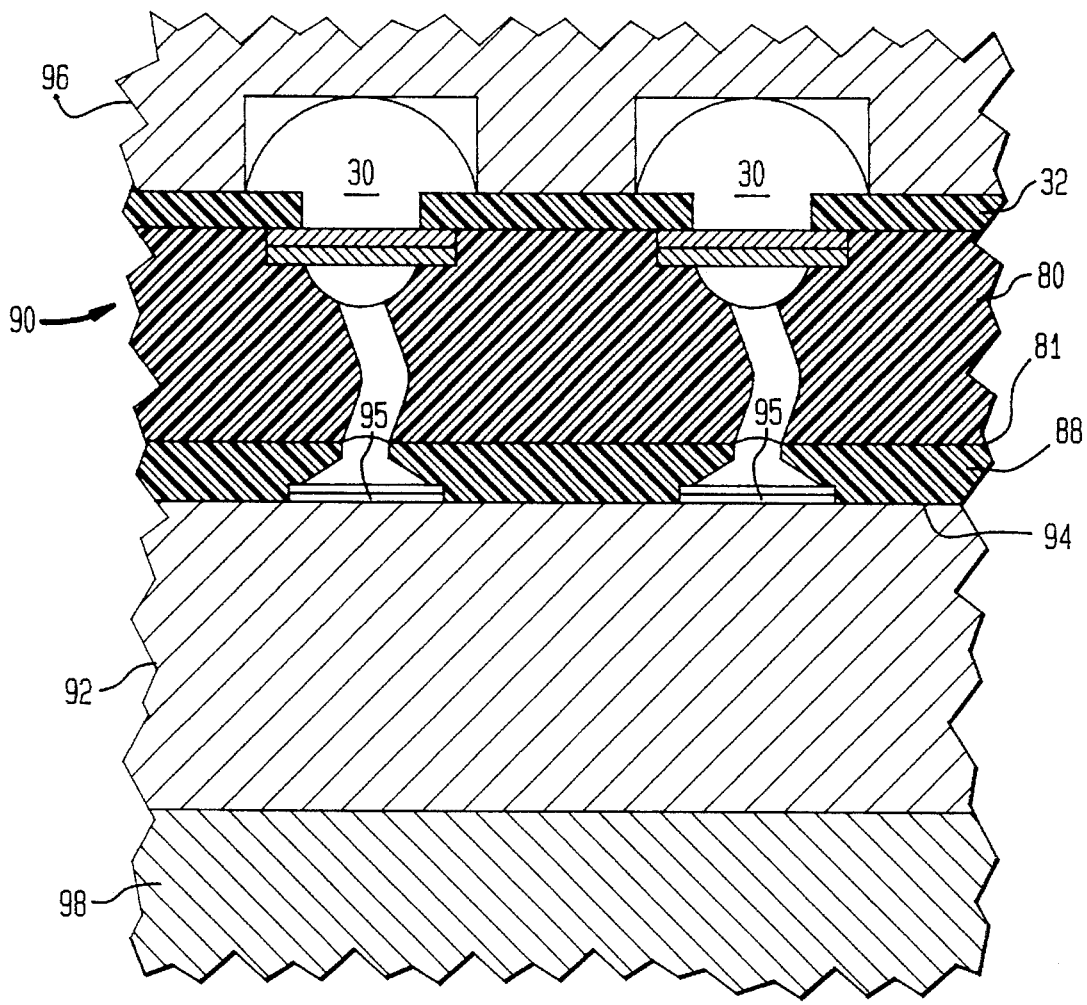
FIG. 6 is a fragmentary schematic sectional view depicting the component of FIGS. 1–5 during assembly to a semiconductor chip.

Following the application of the adhesive, the component is ready for use. As illustrated in FIGS. 6 and 7, the finished connection component 90 is placed onto a semi-conductor chip 92 so that the bottom surface 81 of support layer 80, and adhesive layer 88 confront the top surface 94 of the chip, and so that top sheet 32 is remote from the chip. The connection component is juxtaposed with the chip so that the bottom end or tip 58 of each lead 57 is aligned with a contact 95 of the chip. For example, the connection component can be positioned on the chip using conventional machine-vision equipment. Because all of the leads 57 are supported by support layer 80, the tips of the leads remain in position relative to one another and relative to terminals 30 and sheet 32. This permits alignment of all of the lead tips with all of the chip contacts simultaneously, without the need for individual alignment of the leads. Also, because all of the lead bottom ends 58 lie substantially in a common plane, all of ends 58 can be brought into engagement with the contacts 95 of the chip simultaneously.

The assembly is subjected to pressure by squeezing it between a top platen 96 engaged with the top surface of sheet 32 and a bottom platen 98, engaged with the bottom surface of the chip, remote from the connection component. This step may be performed under vacuum to substantially eliminate air between the bottom surface of the connection component and the chip. Under this pressure, the compliant layer 80 and flexible leads 57 can deform to compensate for any deviation of the lead tips 58 from perfect planarity. Thus, if any lead tip is slightly out of plane, it will still be brought into engagement with the adjacent chip contact 95. At the same time, the assembly is brought to an elevated temperature at or above the activation temperature of bonding metal 84 and at or above the activation temperature of adhesive sealant 88. Heat may be applied through the platens 96 and 98, or by preheating the connection component or the chip. Typically, the assembly is heated to a temperature of 220 to about 280° C. Under these conditions, the adhesive sealant forms a liquid phase which fills gaps and irregularities between the bottom surface 81 of support layer 80 and the top surface 94 of the chip.

At the same time, the bonding metal forms a liquid phase at the interface between the bottom and/or tip 58 of each lead 57 and the aligned contact 95 of the chip. Where the bonding metal 84 is a tin or tin based alloy and the leads 57 and contacts 95 are formed principally of gold, the tin and gold form a liquid eutectic phase as the temperature rises above 217° C. As the temperature increases further, more gold dissolves in the eutectic phase. At the same time, the tin diffuses rapidly into the surrounding gold. Thus, the small liquid phase at the interface becomes progressively depleted in tin and enriched in gold. Desirably, the temperature is raised to about 280° C. during this process. As the liquid phase is depleted of tin, it solidifies and forms a solid weld between the lead 57 and chip contact 95. Such a weld consists essentially of gold with a minor amount of tin diffused throughout the weld region. The weld has a melting point far above the range of temperatures used to form it. The exact composition and exact melting point of the weld will depend upon the temperature and time used to form the weld. During the elevated temperature treatments used to form the weld, the liquid phase formed from adhesive 88 solidifies and forms a substantially void-free interface between the chip and support layer 80 of the connection component.

As a result of this treatment, the chip and connection component form a subassembly substantially as illustrated in FIG. 7, with the connection component 90 on top of chip 92, and with each contact on the chip connected to a terminal 30 of the connection component as illustrated in FIG. 7. Where the top sheet 32 of the connection component is provided in the form of a larger tape, the subassembly can be severed from the tape as illustrated in FIG. 7, or else can be left in tape form, as shown in FIG. 5 in an earlier stage, so that the chips incorporated in numerous subassemblies are all attached to a common tape for handling and placement. Whether provided in a severed form or in a tape form, the subassemblies can be tested by engaging the entire array of terminals 30 with a test fixture including a matching array of test contacts, and actuating the chip through the so-engaged terminals and test contacts. Because the leads 57 and top sheet 32 are flexible and because support layer 80 is compliant, the terminals 30 can be displaced downwardly in the Z-direction towards the chip. This greatly facilitates engagement of the contacts with the test fixture. After the subassembly has been tested, it is attached to a substrate such as a circuit panel, circuit board, or multi-chip module substrate (not shown) by securing the terminals 30 to the electrical contact pads of the substrate. This step can be performed by conventional solder bonding and other bonding processes, such as those commonly used for flip-chip bonding. Alternatively, the subassembly can be attached to the substrate by clamping the subassembly and substrate together, so that the terminals 30 bear on the electrical contact pads of the substrate. In this arrangement, the terminals 30 of the top sheet are maintained in compression against the contact pads of the substrate, as by a permanent clamp or spring. The substrate may carry numerous electrical components such as numerous chips and typically will have dense, closely spaced electrical interconnections. The substrate itself may be intended for attachment to a larger assembly as, for example, where the substrate includes a small panel with numerous pins or other features for engagement in a socket or other connector. One particularly useful assembly includes several chips with interrelated functions mounted to a common substrate and secured together in a single package, case or potting to form a multi-chip assembly commonly referred to as a "multichip module". In such a module, one or more of the chips may be provided as subassemblies according to the present invention. Particularly where numerous chips are mounted on a single substrate, the compact arrangement of the present subassembly provides significant advantages. As can be seen in FIG. 7, the subassembly may have an area in the X-Y plane (the plane parallel to the front face of the chip) no larger than the chip itself or only slightly larger. The spacing of contacts 30 may be exactly the same as those of the contact pads on the chip. Because the leads and top sheet are flexible, and because the support layer is compliant, the terminals 30 can move horizontally (parallel to the front face of the chip) and thereby compensate for any differences in thermal expansion between the chip and the substrate attached to terminals 30.

Numerous variations and combinations of the features discussed above can be utilized without departing from the present invention as defined by the claims. As illustrated in FIG. 8, the bonding metal of each lead 57 may include a layer of tin 101 formed by hot dipping, i.e., by dipping the balls 58 into a bath of molten tin. Such a hot dipping process however should be carefully controlled and very brief so as to avoid unwanted diffusion of tin into the gold of the lead. Such a controlled dipping process can be accomplished by providing the molten metal in a wave bath similar to that used for wave soldering. The component is held above the bath, with the bottom ends of the leads facing downwardly. The wave of molten metal contacts the ball 58 on the bottom end of each lead briefly. The same process can be followed at a somewhat lower temperature using a an alloy of two or more components selected from the group consisting of gold, tin, germanium and silicon. Preferably, the alloy includes gold. Such a dipping process typically would be performed before application of the support layer, so as to avoid heat damage to the support layer. Alternatively, as shown in FIG. 9, a layer of a gold and tin solder paste can be applied on the tips of balls 58. Such a layer can be momentarily melted or "reflowed" to form a continuous layer 102 and to form a gold-tin alloy. Thus, a solder paste formed from 90 percent tin and 10 percent gold by weight can be reflowed at about 217° C. and held at that temperature until it saturates with gold. Such a gold saturated layer will have an activation temperature of about 285° C. During activation at that temperature, it will consume gold until it reaches the eutectic composition of about 80 percent gold, 20 percent tin. As discussed above, such a eutectic will then be converted into a solid gold weld during the assembly process.

As illustrated in FIGS. 10 and 11, a bonding material such as a solder paste 104 may be disposed on a platen 106. Platen 106 is formed from a material which will not bond to the bonding material or to any liquid phase formed from the bonding material. Where the bonding material is a gold-tin solder, suitable platen materials include molybdenum, glass, and stainless steel. Preferably, the bonding material is provided in the form of spots 104 at spaced apart locations on the platen corresponding to the locations of the lead tips 158. For example, the spots may be provided on the platen by using a photoetched mask as a stencil, or by silk-screening. The platen may also have holes or depressions disposed at the desired locations to receive the bonding material. Preferably, the tips or bottom ends 158 of the connection component leads 157 are brought to a uniform plane by engagement with a platen as discussed with reference to FIG. 3 and a support layer 180 is formed around the leads leaving the bottom ends 158 exposed slightly at the surface 181 of the support layer. While the terminals and top sheet are supported as by a further platen (not shown), the connection component is advanced towards the platen 106 bearing the bonding material. The bonding material and the adjacent portions of the leads are brought to a temperature sufficient to form a liquid phase including the bonding material and the immediately adjacent portions of the lead tip. The assembly is then cooled, leaving a flat tip surface 159 generally in the horizontal plane (the plane parallel to the plane of the top sheet) on the tip 158 of each lead 157. Where the bonding material forms a eutectic, as in the gold-tin system discussed above, the time and temperature cycle is controlled so as to avoid complete diffusion of the tin into the adjacent gold lead. Thus, the material present at surface 159 remains in a relatively low melting tin-gold alloy. The tip surface forming operation serves to bring all of the tip surfaces 159 into precise alignment with a common plane established by platen 106. Thus, when the component is engaged with a semiconductor chip or other component, all of the surfaces can be engaged readily with the chip contacts. Also, the large area of engagement between the flat tip of each lead and each chip contact will tend to promote formation of a strong bond.

Bonding materials other than the tin-gold alloy discussed above can be employed. For example, a solder adapted to wet the materials of the leads and of the contacts on the surface of the microelectronic unit to be attached can be employed. Other, non-metallic bonding materials such as conductive polymers adapted to flow at the temperatures used in the process can also be employed. For example, the bonding material may include a thermoplastic polymer or a curable polymer precursor such as an uncured or partially cured epoxy with a conductive material such as gold dispersed therein. The conductive material typically constitutes about 40% to about 50% by volume of such a bonding material. Metallic bonding materials are preferred, however, because they form a metallurgical bond between the leads and the contacts of the chip or other microelectronic unit. In the embodiments discussed above, the bonding material forms a liquid or flowable phase at the interface between the bottom end of each lead and the contact on the chip or other microelectronic unit. However, it is not always essential to form such a phase. Bonding can be accomplished by interdiffusion of the lead bottom end materials and the materials of the chip contacts, without formation of a liquid or flowable phase.

In the arrangements discussed above, the support layer is a compliant layer which forms a permanent part of the assembly. However, the support layer may also be formed from a fugitive material which can be removed after connection of the leads to the chip or other microelectronic unit. The support layer may be formed from a polymeric material which can be dissolved by a solvent that does not attack the top sheet. Such materials include, for example, polymers such as Polymethylmethacrylate. Alternatively, the support layer may be formed from a material such as a polyolefin which will melt or evaporate at a relatively low temperature, so that the material can be removed by baking at such temperature without destroying the other components of the unit. Such a fugitive support layer can be used for example where it is intended to encapsulate the entire assembly with an elastomeric material. In such case, the fugitive layer can be removed leaving a gap between the top sheet and the microelectronic unit and the elastomer used for encapsulation can be injected between the top sheet and the microelectronic unit.

In the embodiments illustrated above, the tips of the leads are disposed below the associated terminals, in vertical alignment therewith. Thus, although each lead is bowed or curved, a straight line directly from each lead to the associated terminal would be perpendicular to the horizontal planes of the top sheet and chip. However, the leads can be arranged at oblique angles to the horizontal plane, to that each lead tip is offset horizontally from the associated terminal. Such offsets may be uniform or non-uniform among the different leads.

In the embodiments discussed above, the microelectronic unit assembled to the connection component is semiconductor chip. However, microelectronic units other than semiconductor chips can be employed. Thus, a microelectronic unit used with the present connection components may, in fact, include a substrate mounting one or more semiconductor chips. As shown in FIG. 12, such a substrate 300 may be a generally planar dielectric body with internal electrical conductors terminating in contact pads on a first surface 301 of the body (not shown). Several semiconductor chips 302 may be mounted to one side of the substrate and connected to the contact pads of the substrate using connection components 304 and methods as described above. Additional circuit elements 306, such as other chips, capacitors, inductors and the like, are also mounted on the substrate and connected to the contact pads. The internal electrical conductors of the substrates interconnect all of the chips 302 and elements 306. The substrate body also has electrical contacts (not shown) on a second surface 308. These contacts are electrically connected to the internal electrical conductors of the substrate. A casing and potting compound 310, only partially illustrated in FIG. 12, covers the first surface of the body and also covers the chips 302, connection components 304 and other elements 306 mounted to the body, so as to form a sealed module 312. Module 312 is mounted to a circuit panel 314 using a further connection component 316 in accordance with the invention. Component 316 is the same as the connection components described above but of a larger size. Thus, the compliant, elastomeric support layer 318 and flexible top layer 320 each have dimensions equal to the dimensions of substrate 300. The leads extending through support layer 318 and the terminals on top layer 320 are disposed at locations corresponding to the contacts on surface 308 of the substrate. Connection component 316 is mounted to module 312 using heat and pressure as discussed above, so as to form bonds between the leads of the connection component and the contacts on surface 308 of the substrate, and also to form a sealed, bonded interface between the support layer 318 of the connection component and surface 308. This forms a subassembly including the module and connection component 316. The subassembly is then tested in substantially the same way as the chip subassemblies discussed above, as by engaging the terminals on the top layer 320 of the connection component with a test fixture. Following the testing step, the module is connected to a larger circuit panel 314, as by solder-bonding or pressure-engaging the terminals on top layer 320 of the module connection component with the electrical conductors 322 of the panel.

As these and other variations and combinations of the features discussed above can be utilized without departing from the present invention, the foregoing description of the preferred embodiments should be taken by way of illustration rather than by way of limitation of the present invention as defined by the claims.

What is claimed is:

1. A component for forming connections to a microelectronic unit comprising:

(a) a flexible dielectric top sheet having oppositely facing top and bottom surfaces and holes extending through the top sheet;

(b) a plurality of electrically conductive terminals mounted on said top surface of said top sheet;

(c) a compliant dielectric support layer underneath said top sheet, said support layer having a bottom surface remote from said top sheet; and (d) a plurality of flexible, electrically conductive, elongated leads connected to said terminals through said holes in said top sheet and extending side-by-side downwardly from said terminals through said support layer, each said lead having a lower end adjacent the bottom surface of said support layer, said lower ends of said lead having means for bonding to contacts on a microelectronic unit when the component is engaged with a unit under predetermined temperature and pressure conditions, and thereby electrically connecting said terminals with the contacts on the surface, said support layer surrounding and supporting said leads.

2. A component as claimed in claim 1 wherein said leads are curved.

3. A component as claimed in claim 1 wherein each said lead includes a wire connected to one said terminal.

4. A component as claimed in claim 3 wherein each said wire has a bulbous tip remote from the terminal at the bottom end of the lead and an enlarged transition section at a juncture between the wire and the associated terminal.

5. A component as claimed in claim 4 wherein each said wire is between about 100 microns and about 1000 microns long and between about 25 microns and about 100 microns in diameter remote from said bulbous tip and transition section.

6. A component as claimed in claim 4 wherein each said wire has a bend between said bulbous tip and said transition section.

7. A component as claimed in claim 1 or claim 12 wherein each said lead is formed from a structural metal and each said lead has a bonding metal different from said structural metal on the lower end of the lead, said bonding metal being adapted to form a liquid phase upon exposure to said predetermined temperature.

8. A component as claimed in claim 7 wherein said structural metal includes gold and said bonding metal includes one or more metals selected from the group consisting of tin, silicon and germanium.

9. A component as claimed in claim 1 wherein each said lead is formed from a structural metal and each said lead has a bonding composition including a polymeric material and conductive material dispersed therein on the lower end of the lead, said bonding composition being adapted to form a flowable phase upon exposure to said predetermined temperature.

10. A component as claimed in claim 1 wherein said support layer is an elastomeric layer.

11. A component as claimed in claim 1 A component for forming connections to a microelectronic unit comprising:

(a) a flexible dielectric top sheet having oppositely facing top and bottom surfaces and holes extending through the top sheet;

(b) a plurality of electrically conductive terminals mounted on said top surface of said top sheet;

(c) a support layer underneath said top sheet, said support layer having a bottom surface remote from said top sheet, said support layer being soluble in at least one solvent which does not dissolve said top layer, whereby said support layer can be removed by exposure to such solvent, and;

(d) a plurality of flexible, electrically conductive, elongated leads connected to said terminals through said holes in said top sheet and extending side-by-side downwardly from said terminals through said support layer, each said lead having a lower end adjacent the bottom surface of said support layer, said lower ends of said leads having means for bonding to contacts on a microelectronic unit when the component is engaged with a unit under predetermined temperature and pressure conditions, and thereby electrically connect said terminals with the contacts on the surface, said support layer surrounding and supporting said leads.

12. A component as claimed in claim 1 wherein the bottom end of each said lead is disposed directly beneath the terminal to which such lead is connected, in vertical alignment therewith so that a straight line from the bottom end of each lead to the associated terminal is substantially perpendicular to the top sheet.

13. A component as claimed in claim 1 wherein said leads and terminals are disposed in a substantially regular horizontally-extensive grid.

14. A component as claimed in claim 13 wherein adjacent leads and adjacent terminals are spaced apart from one another by between about 200 microns and about 3000 microns.

15. A component for forming connections to a microelectronic unit comprising:

(a) a dielectric structure having top and bottom surfaces;

(b) a plurality of electrically conductive terminals disposed adjacent said top surface;

(c) a plurality of electrically conductive, elongated leads connected to said terminals and extending downwardly from the terminals through said dielectric structure, each said lead having a lower end at said bottom surface; and (d) an sealant distributed on said bottom surface, said sealant being adapted to seal the bottom surface of the dielectric structure to a microelectronic unit when the component is juxtaposed with the unit and subjected to predetermined temperature and pressure conditions, said lower ends of said leads including means for bonding to contacts on the surface of the unit under said predetermined temperature and pressure conditions and thereby electrically connect said terminals with the contacts on the surface of the unit.

16. A component as claimed in claim 15 wherein each said lead is formed from a structural metal and has a layer of a bonding material different from said structural metal at its lower end, said bonding material being adapted to form a liquid phase upon exposure to said predetermined temperature.

17. A component as claimed in claim 16 wherein said bonding material is a bonding metal different from said structural metal.

18. A component as claimed in claim 17 wherein said bonding metal is adapted to form a low melting point alloy with said structural metal.

19. A component as claimed in claim 18 wherein said structural metal includes gold and said bonding metal includes an alloy of gold with at least one metal selected from the group consisting of tin, germanium and silicon.

20. A component as claimed in claim 15 wherein said dielectric structure includes a flexible top layer and a compliant support layer disposed beneath said top layer, said terminals being mounted on said top layer, said leads extending through said support layer, said leads being flexible.

21. A component as claimed in claim 20 wherein each said lead is curved.

22. A component as claimed in claim 15 wherein said bottom surface is substantially planar.

23. A component as claimed in claim 15 wherein said sealant includes an adhesive adapted to bond to said microelectronic unit and to said dielectric structure upon exposure to said predetermined temperature and pressure conditions.

* * * * *

UNITED STATES PATENT AND TRADEMARK OFFICE
CERTIFICATE OF CORRECTION

PATENT NO. : 5,455,390
DATED : October 3, 1995
INVENTOR(S) : DiStefano et al.

It is certified that error appears in the above-identified patent and that said Letters Patent is hereby corrected as shown below:

Column 3, line 7 through column 3, line 44, beginning at "provide similar improvements" and ending at "remote from the terminal at the" DELETE AND INSERT at column 2, line 40 before the words "bottom end".

Column 16, line 22, delete "A component as claimed in claim 1".

Signed and Sealed this

Ninth Day of January, 1996

Attest:

BRUCE LEHMAN

Attesting Officer

Commissioner of Patents and Trademarks